(12) United States Patent  
Lee

(10) Patent No.: US 6,621,113 B2
(45) Date of Patent: Sep. 16, 2003

(54) SELF-ALIGNED SHALLOW TRENCH ISOLATION

(75) Inventor: Chiu-Te Lee, Hsinchu (TW)

(73) Assignee: United Microelectronics Copr., Hsinchu (TW)

( * ) Notice: Subject to any disclaimer, the term of this patent is extended or adjusted under 35 U.S.C. 154(b) by 0 days.

(21) Appl. No.: 10/122,585

(22) Filed: Apr. 15, 2002

(65) Prior Publication Data

US 2002/0123208 A1 Sep. 5, 2002

Related U.S. Application Data

(62) Division of application No. 09/797,233, filed on Mar. 1, 2001, now Pat. No. 6,514,816.

(51) Int. Cl.$^7$ .............................................. H01L 27/08
(52) U.S. Cl. ...................................................... 257/302
(58) Field of Search ................................ 257/288, 296, 257/301, 302

(56) References Cited

U.S. PATENT DOCUMENTS

| | | | |
|---|---|---|---|
| 6,399,978 B1 * | 6/2002 | Gruening et al. | 257/301 |
| 6,432,774 B2 * | 8/2002 | Heo et al. | 438/270 |
| 6,437,388 B1 * | 8/2002 | Radens et al. | 257/301 |
| 6,514,817 B1 * | 2/2003 | Tsai et al. | 438/248 |
| 6,528,367 B1 * | 3/2003 | Lee | 438/253 |
| 6,534,359 B2 * | 3/2003 | Heo et al. | 438/243 |
| 6,566,227 B2 * | 5/2003 | Wensley et al. | 438/430 |

* cited by examiner

Primary Examiner—Long Pham
(74) Attorney, Agent, or Firm—Charles C. H. Wu; Wu & Cheung, LLP

(57) ABSTRACT

A method of fabricating a self-aligned shallow trench isolation. A mask layer, two deep trenches and two internal electrodes of a capacitor are sequentially formed on a substrate. Two conductive layers are used to completely fill the two deep trenches. Then, two spacers are formed on exposed sides of the two conductive layers, and two doped regions are formed in a portion of the substrate located next to the two conductive layers. A patterned photoresist layer is formed to expose at least the spacers located in between the two deep trenches and the mask layer. The photoresist layer and the spacers are utilized as masks to etch away the exposed mask layer. The photoresist layer is utilized again as a mask to etch the exposed spacers and a portion of the exposed substrate. Sequentially, a remained portion of the photoresist layer and a portion of the conductive layers are removed. A remained mask layer is used as a mask to remove a portion of the exposed substrate, and a trench is thus formed. Finally, a shallow trench isolation is formed in the trench.

4 Claims, 3 Drawing Sheets

SELF-ALIGNED SHALLOW TRENCH ISOLATION

The divisional of Application Ser. No. 09/797,233, filed Mar. 1, 2001, now U.S. Pat. No. 6,514,816.

BACKGROUND OF THE INVENTION

1. Field of Invention

The present invention relates generally to a semiconductor process. More particularly, the present invention relates to a method of fabricating a self-aligned shallow trench isolation (SASTI).

2. Description of the Related Art

A capacitor is a part of a dynamic random access memory (DRAM) that stores data. In order to decrease data error and memory refresh, the capacity of the capacitor has to be increased to improve the efficiency of the operation. One method of increasing the capacity of the capacitor is to increase the surface area of the capacitor, wherein the steps of this method comprise: forming a deep trench (DT) in a substrate, and forming a DT capacitor in the deep trench. Because the depth of the deep trench is very deep, a surface area of the capacitor is increased.

However, the DT capacitor utilizes the surface area of the substrate, so a shallow trench isolation (STI) is fabricated on the top of the DT capacitor in order to utilize the surface area of the substrate effectively. A conventional method of fabricating a STI is described as below:

Referring to FIG. 1A, a p-type substrate 100 is provided first and a pad oxide layer 102 and a mask layer 104 of silicon nitride are formed sequentially on the substrate. Two deep trenches 110 are formed in the p-type of substrate 100. An n-type doped region 120 is formed in the p-type substrate 100. An internal electrode 125 of the bottom capacitor and an internal electrode 128 of the top capacitor are formed in the deep trenches 110. A buried plate 121 and an n-type doped region 120 are formed in the p-type substrate 100 located at the lower part of the deep trenches 110. The n-type doped region is very thin and is connected to an n-type doped region 120. The buried plate 121 serves as an external electrode for the DT capacitor. A dielectric layer 123 with a very thin thickness is formed in between the internal electrode 125 of the capacitor and the buried plate 121. The internal electrode 128 of the top capacitor, the p-type substrate 100 and the n-type doped region 120 have a thick collar 127 for isolation. A top surface of the internal electrode 128 of the top capacitor is lower than the surface of the p-type substrate.

Referring to FIG. 1A, an n-type doped polysilicon layer 130 is filled into the deep trench 110 and it covers the top part of the internal electrode 128 of the top capacitor. The top surface of the doped polysilicon 130 is lower than the surface of the p-type substrate 100. A thermal process is carried out to allow doping ions of the n-type doped polysilicon layer 130 to distribute into the surrounding p-type substrate 100. A doped region 140 is thus formed.

Referring to FIG. 1B and FIG. 1A, a photoresist layer 156, which has an opening 158, is formed on the p-type substrate 100. The photoresist layer 156 exposes the mask layer 104 located between the two deep trenches 110 and a portion of doped polysilicon layer 130. The photoresist layer 156 is utilized as a mask to etch away all the parts located in the opening 158. A trench 160 is formed (shown in FIG. 1B). A remained doped polysilicon layer 130 and the doped region 140 are utilized as buried S/D 150.

Referring to FIG. 1C, the photoresist layer 156 is removed followed by filling the trench 160 with silicon oxide to form a STI 170. The mask layer 104 and the pad oxide layer 102c are removed, and a gate 179 and S/D regions 180 located at both sides are formed on the p-type substrate 100. The S/D regions 180 are electrically connected to the internal electrode of the top capacitor 128 by the buried S/D 150.

FIG. 1B illustrates a conventional method of defining the trench 160 that is not a self-aligned method. An alignment problem between the internal electrode of the top capacitor 128 and the trench 160 often will occur. The quality of the capacitor will be affected. From FIG. 1C, most of the doped polysilicon layer 130 is removed during the formation of the trench 160. A contact area between the buried S/D 150 and the internal electrode of the top capacitor 128 is very small; thus, the resistance in that region becomes very large and affects the efficiency of the device.

SUMMARY OF THE INVENTION

The present invention provides a method of fabricating a self-aligned shallow trench isolation, suitable for a device of a DT capacitor. A preferred embodiment of the present invention provides a method of solving the alignment problem between an internal electrode of a capacitor and a STI, and the high resistance problem between a S/D region and the internal electrode of the capacitor.

The method of the present invention comprises the following steps. A mask layer, two deep trenches and two internal electrodes of a capacitor are sequentially formed on a substrate. Two conductive layers are used to completely fill the two deep trenches. A portion of the mask layer is removed to expose the conductive layers. Then, two spacers are formed on the exposed sides of the two conductive layers, and two doped regions are formed in a substrate located next to the two conductive layers. A patterned photoresist layer is formed to expose at least the spacers located in between the two deep trenches and mask layer. The photoresist layer and the spacers are utilized as masks to etch away the exposed mask layer and expose a portion of the substrate. The photoresist layer is utilized again as a mask to etch the exposed spacers and a portion of the exposed substrate. Sequentially, a remained portion of the photoresist layer and a portion of the conductive layers are removed. Simultaneously, a remained mask layer is used as a mask to remove a portion of the exposed substrate, and a trench is thus formed. The remained portion of the conductive layers completely cover the two internal electrodes of the capacitor. The remained portion of the conductive layer and the doped regions are utilized as a buried S/D. Finally, a shallow trench isolation is formed in the trench.

The present invention further provides a stack structure for a DT capacitor and a STI. The structure comprises: a substrate comprising two deep trenches, two internal electrodes of a capacitor, two conductive layers and two doped regions and a STI. The two internal electrodes of the capacitor are located in the two deep trenches. The two conductive layers are located on a top of the two deep trenches, and completely cover a top portion of the two internal electrodes of the capacitor. Top surfaces of the conductive layers are lower than a surface of a substrate located outside the two deep trenches, and a surface of a substrate in between the deep trenches is lower than the top surfaces of the conductive layers. A trench is thus formed. The substrate, which is located in between two deep trenches has a side portion and a central portion, and the side portion is higher than the central portion. The two doped regions are next to the substrate of the two conductive layers. The two doped regions and the two conductive layers are utilized as two buried S/D. A doping type of the two doped regions and the two conductive layers is different. The STI is filled into the trench.

It is to be understood that both the foregoing general description and the following detailed description are exemplary and explanatory only and are not restrictive of the invention, as claimed.

DESCRIPTION OF THE PREFERRED EMBODIMENTS

Figure 2A:
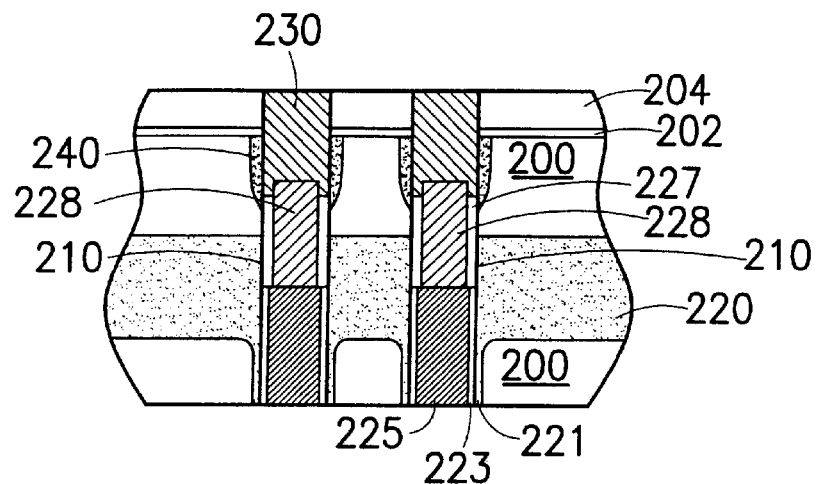
FIGS. 2A–2F illustrate cross-sectional views of a method of fabricating a STI on the top of a DT capacitor in accordance with a preferred embodiment of the present invention.

Referring to FIG. 2A, a substrate 200 is first provided, and a mask layer 204 and a pad oxide layer 202 are formed over the substrate 200. The mask layer 204, which covers a pad oxide layer 202, can be made of silicon nitride. A deep trench 210 is formed through the mask layer 204, the pad oxide layer 202 and into the substrate 200. A doping region 220 is already formed in the substrate 200. The doping type of the doping region 220 will be different from the substrate 200. An internal electrode 228 located at an upper part of a capacitor is formed in the deep trench 210, and an internal electrode 225 located at a lower part of the capacitor is formed in the deep trench 210. A buried plate 221 of the doping region 220 is formed in the substrate 200. The buried plate 221 is located at the periphery of the lower part of the deep trench 210. The thickness of the buried plate 221 is very thin and has the same doping type as the doping region 220, and it serves as an external electrode of the capacitor. FIG. 2A shows a thick dielectric layer 223 in between the lower internal electrode 225 of the capacitor and the buried plate 221. The dielectric layer 223 is ONO multi-layers, for example. A thick collar 227 is in between the internal electrode 228 of the upper capacitor, substrate 200 and the doping region 220. The collar 227 is preferably made of silicon oxide in order to achieve isolation. The base of the internal electrode of the upper capacitor 228 is lower than the surface of the substrate 200.

Referring to FIG. 2A, a doped polysilicon layer 230 is completely filled into the deep trench 210. The doping type of the doped polysilicon layer 230 differs from the substrate 200, such as an n-type. A thermal process is carried to allow doping ions of the doped polysilicon layer 230 distribute into the substrate 200 in order to form a doped region 240. The doping type of the doped region 240 is the same as the doped polysilicon layer 230, but differs from the substrate 200.

Figure 2B:
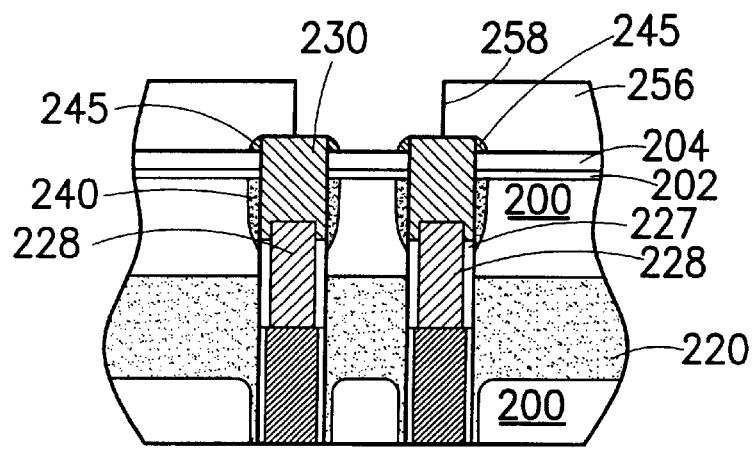

Referring to FIG. 2B, a portion of the mask layer 204 is removed by a global etching process; thus, the doped polysilicon layer 230 is partially exposed. A polysilicon spacer 245 is formed at the exposed side of the doped polysilicon layer 230. A patterned photoresist layer 256, which is formed on the substrate 200, has an opening 258. The opening 258 exposes the mask layers 204 located between the doped polysilicon layers 230, the polysilicon spacer 245 of the exposed side of the doped polysilicon layer 230 and a portion of the polysilicon layer 230.

Figure 2C:
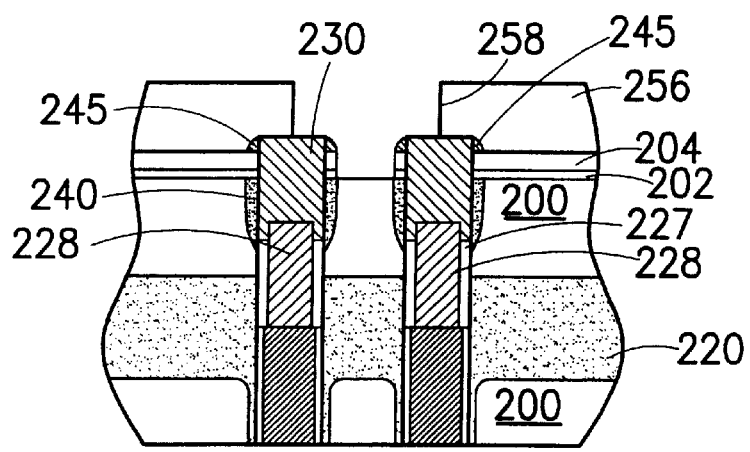

Referring to FIG. 2C, the photoresist layer 256 and the polysilicon spacer 245 serve as a mask to remove the exposed pad oxide layer 202 and the exposed mask layer 204 in between the polysilicon spacer 245, and a portion of the substrate 200 is exposed.

Figure 2D:
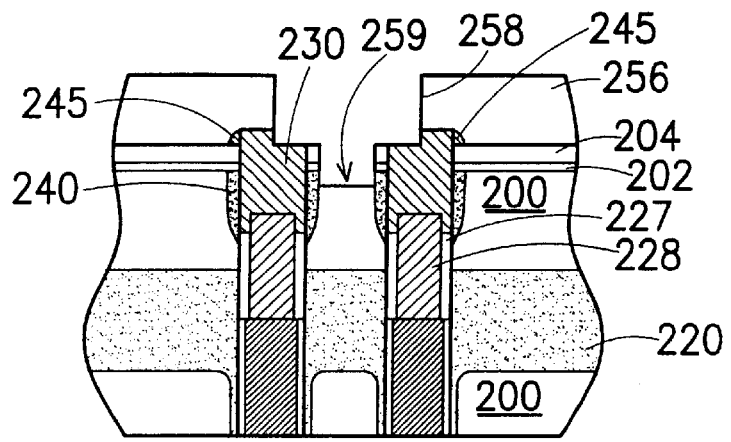

Referring to FIG. 2D, the photoresist layer 256 serves as a mask to etch away the polysilicon spacer 245 of the exposed side of the doped polysilicon layer 230, and simultaneously remove a portion of the exposed substrate 200. A portion of the doped polysilicon layer 230 is thus exposed. Then, the polysilicon spacer 245 is completely removed. The surface of the exposed substrate 200 is lower than the surface of the substrate 200 at another region. Thus a trench 259 is formed.

Figure 2E:
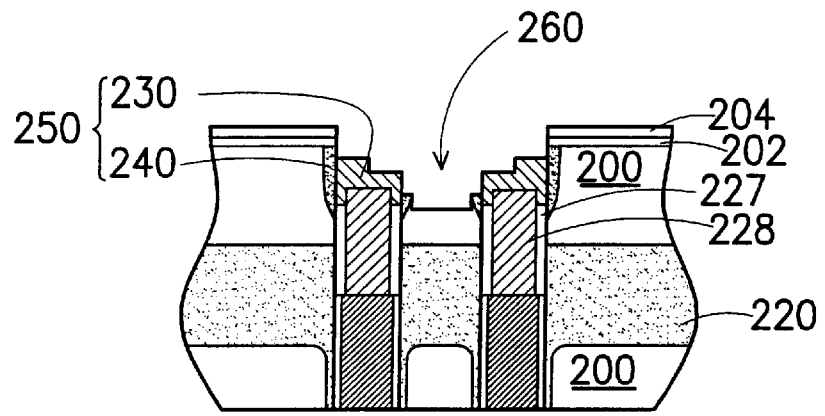

Referring to FIG. 2E and comparing to FIG. 2D, the photoresist layer is used to serve as a mask to remove the mask layer 204 and the pad oxide layer 202, which are located between the doped polysilicon layer 230. The removal method can be performed by an isotropic etching method or a wet etching method. The photoresist layer 256 is removed, followed by etching away the polysilicon spacer 245 outerside of the doped polysilicon layer 230 and a portion of doped polysilicon layer 230. Simultaneously, the mask layer 204 is used to serve as a mask in order to remove a portion of the exposed substrate 200. Finally, the etching process is carried out until the upper surface of the remaining doped polysilicon layer 230 is lower than the surface of the substrate 200 located outside of the doped polysilicon layer 230. A shallow trench 260 is thus formed. The height difference between the upper surface of the doped polysilicon layer 230 and the surface of the outside substrate 200 is approximately 1200 Å. The remaining doped polysilicon layer 230 completely covers the top part of the internal electrode 228 located at the upper part of the capacitor. The remaining doped polysilicon layer 230 and the doped region 240 are used to serve as buried S/Ds.

Figure 2F:
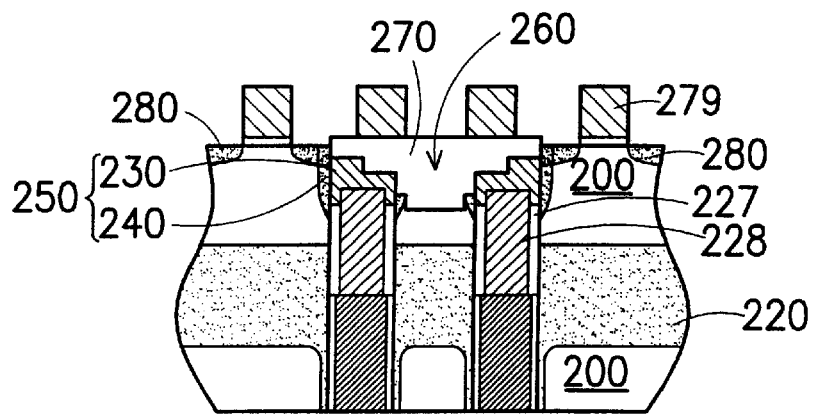

Referring to FIG. 2F, an insulating material, which is filled into the shallow trench 260 and can be silicon oxide that is obtained by chemical vapor deposition (CVD) method, is used as an insulator 270 for the shallow trench 260. The mask layer 204 and the pad oxide layer 202 are removed to fabricate a gate 279 and S/D regions 280 at both sides of the substrate 200. The S/D regions 280 are electrically connected to the buried S/D 250, and by utilizing the buried S/D 250, the S/D regions 280 are electrically connected to the internal electrode 228 of the upper capacitor.

Figure 1A:
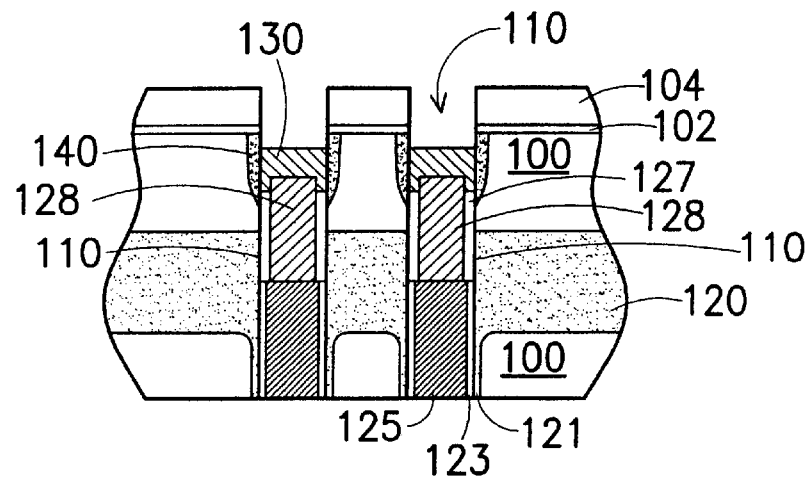
FIGS. 1A–1C illustrate cross-sectional views of a method of fabricating a STI on the top of a DT capacitor in accordance with a conventional method.
Figure 1B:
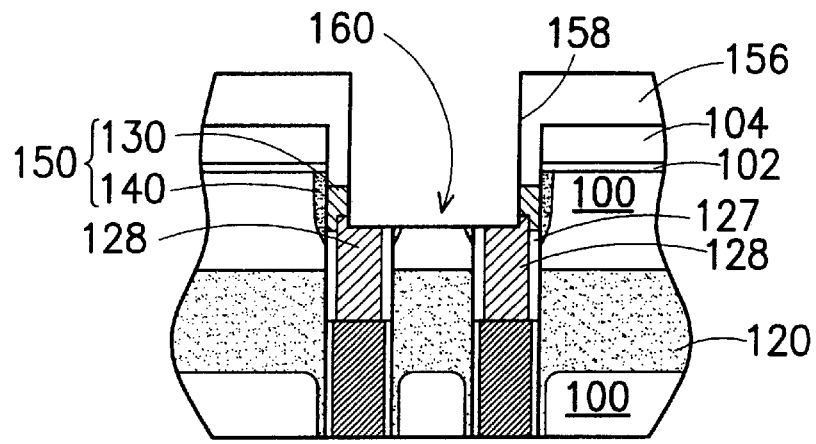
Figure 1C:
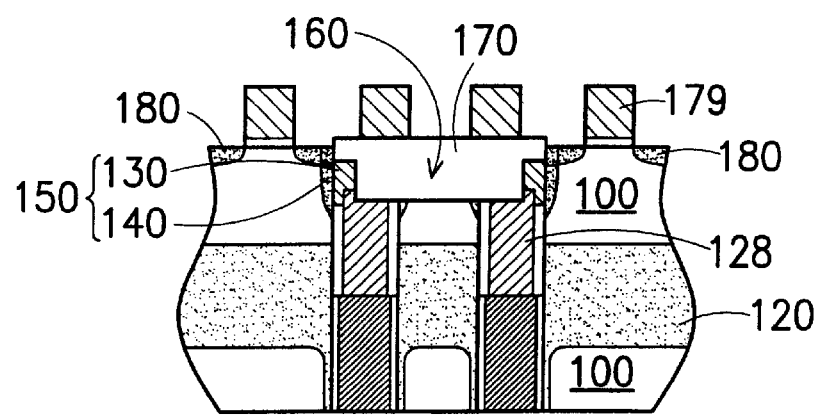

From the above-mentioned, the present invention provides a method of fabricating an insulator of a trench having the following advantages. As shown in FIGS. 2C–2E, the polysilicon spacer 245 is used as the mask to remove the exposed mask layer 204 and the pad oxide layer 202 in accordance with the preferred embodiment. The polysilicon spacer 245 at the inner side of the polysilicon layer 230 is etched, and simultaneously a portion of the exposed substrate 200 is removed. A trench 259 is thus formed. Thus, the fabrication method of the present invention is a self-aligned process, and the alignment problem between the internal electrodes of the capacitor and the trenches in the conventional method can be avoided. Referring to FIG. 2F, the buried S/D 250 completely covers the top part of the internal electrode 228 located at the upper part of the capacitor. The contact areas of the buried S/D 250 and the internal electrode 228 located at the upper part of the capacitor are larger than the conventional one (FIG. 1C). Thus the resistance between the S/D regions 280 and the internal electrode 228 of the capacitor is reduced, and the efficiency of the device is improved.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A stack structure for a deep trench type of capacitor and a shallow trench isolation suitable for use on a substrate, the stack structure comprising:

two deep trenches formed in the substrate;

two internal electrodes of a capacitor located in the two deep trenches;

two conductive layers located on a top part of the two deep trenches and completely covering a top portion of the two internal electrodes of the capacitor, wherein top surfaces of the conductive layers are lower than a surface of a substrate located outside the two deep trenches, and wherein a surface of a substrate in between the deep trenches is lower than the top surfaces of the conductive layers, thus forming a trench; wherein the substrate, which is located in between two deep trenches has a side portion and a central portion, and the side portion is higher than the central portion;

two doped regions located next to the substrate of the two conductive layers, wherein the two doped regions and the two conductive layers are utilized as buried S/D, and a doping type of the two doped regions is different from a doping type of the substrate; and a shallow trench isolation filled into the trench.

2. The structure of claim 1, wherein a top part of the two conductive layers comprise a first region and a second region, wherein the first region is close to a portion of the substrate located outside the shallow trench isolation and the second region is close to a portion of the substrate located at a lower part of the shallow trench isolation, and a top surface of the first region is higher than a top surface of the second region.

3. The structure of claim 1, wherein the top surfaces of the two doped polysilicon layers are approximately 1200 Å lower than the surface of the substrate located outside the two deep trenches.

4. The structure of claim 1, wherein the two conductive layers are doped polysilicon layers, and the two doped regions are formed by distributing dopant ions from the two doped polysilicon layers.

* * * * *